United States Patent [19]

Poultney

[11] Patent Number: 5,312,510
[45] Date of Patent: May 17, 1994

[54] APPARATUS FOR OPTIMALLY SCANNING A TWO-DIMENSIONAL SURFACE OF ONE OR MORE OBJECTS

[75] Inventor: Sherman Poultney, Ridgefield, Conn.

[73] Assignee: Hughes Aircraft Company, Los Angeles, Calif.

[21] Appl. No.: 36,310

[22] Filed: Mar. 24, 1993

Related U.S. Application Data

[62] Division of Ser. No. 899,419, Jun. 16, 1992, Pat. No. 5,282,921.

[51] Int. Cl.$^5$ .................... H01L 21/306; B44C 1/22
[52] U.S. Cl. ..................................... 156/345; 156/635; 156/654; 156/657; 156/662; 156/643
[58] Field of Search ............... 156/345, 635, 626, 654, 156/657, 662, 643; 219/121.4, 121.41, 121.42, 121.43; 204/298.31, 298.32, 298.36

[56] References Cited

U.S. PATENT DOCUMENTS

| | | | |
|---|---|---|---|
| 3,993,909 | 11/1976 | Drews et al. | 250/492 |
| 4,274,004 | 6/1981 | Kanai | 250/442 |
| 4,505,585 | 3/1985 | Yoshikawa et al. | 356/237 |
| 4,668,366 | 3/1987 | Zarowin | 204/192.1 |
| 5,223,080 | 6/1993 | Ohta et al. | 156/626 |

FOREIGN PATENT DOCUMENTS 0514046 11/1992 European Pat. Off. .

*Primary Examiner*—William Powell
*Attorney, Agent, or Firm*—M. E. Lachman; M. W. Sales; W. K. Denson-Low

[57] ABSTRACT

An apparatus for optimally scanning a surface of one or more semiconductor wafers undergoing a chemical etching process, comprising: (a) means for registering the semiconductor wafers to a wafer retention stage; and (b) means for controlling a spiral pattern movement of a spiral type scan of the surface of the semiconductor wafers by the chemical etching instrument probe, whereby the surface is figured to correspond to a desired thickness.

8 Claims, 5 Drawing Sheets

APPARATUS FOR OPTIMALLY SCANNING A TWO-DIMENSIONAL SURFACE OF ONE OR MORE OBJECTS

This is a division of application Ser. No. 07/899,419 filed Jun. 16, 1992, U.S. Pat. No. 5,282,921.

BACKGROUND OF THE INVENTION

1. Field of the Invention

The present invention relates to methods for scanning a two-dimensional surface of one or more objects and, more particularly, to an apparatus and method for optimally scanning, for example, the surface of one or more semiconductor wafers undergoing a chemical etching process.

2. Description of the Prior Art

In one particular application wherein the present invention is especially practical, a silicon-on-insulator (SOI) semiconductor wafer undergoes a chemical etching process. During this process, a chemical etching instrument induces a removal of material from a surface of the SOI semiconductor wafer. The material is removed as a result of a chemical reaction that occurs between the surface material of the SOI wafer and a plasma that is generated by the chemical etching instrument. Such an instrument is described in a related patent application entitled, System for Removing Material from a Wafer, U.S. patent application Ser. No. 07/696,897, filed on May 7, 1991 U.S. Pat. No. 5,254,830. As described in this system, a chemical etching instrument probe is scanned over the surface of a wafer in a controlled pattern. While scanning the wafer surface, the probe emits a plasma that induces a constant-rate material removing chemical reaction. The scanning technique that is used in this system is commonly referred to as a boustrophedon type scan, or an XY bidirectional raster scan.

A boustrophedon type scan operates in two orthogonal directions, i.e. the X-axis and Y-axis coordinate planes. In the material removal system described in the above referenced patent application, the boustrophedon type scan of the chemical etching instrument operates by scanning the probe across the surface of the wafer in a positive and a negative X-axis coordinate plane direction while indexing in a positive or a negative Y-axis coordinate plane direction. Thus, the probe may scan across the wafer surface in the positive X-axis coordinate plane direction, index a predetermined distance in the positive Y-axis coordinate plane direction, scan across the wafer surface in the negative X-axis coordinate plane direction, and then index a further predetermined distance in the positive Y-axis coordinate plane direction. This scan pattern is repeated until the entire surface of the wafer is scanned. Also, since the probe maintains a constant-rate material removing chemical reaction, the scan speed of the probe in relation to the wafer surface is adjusted so as to perform a desired removal of wafer surface material.

Although the boustrophedon type scan permits the material removal system to accomplish its basic objective of scanning the entire wafer surface, the boustrophedon method encounters mechanical problems at high wafer throughput rates and exhibits depreciative etching of surround materials at all wafer throughput rates. The mechanical problems are focused on the indexing, or turnaround, steps of the controlled scan pattern and, to a lesser degree, the scan speed adjustments. The turnaround steps and the scan speed adjustments require a motor to control the precision indexing and the scan speed variations, respectively. Consequently, mechanical stress is inflicted on the motor. Furthermore, as the scan rate is increased, the amount of the mechanical stress inflicted upon the motor is increased. It should be noted that this mechanical stress can be inflicted on either a wafer retention stage motor or a chemical etching instrument motor, depending upon which is used to perform the controlled scan pattern.

The depreciative etching problems are due to the wafer being typically placed on a surround that is secured to a wafer retention stage. The wafer is registered to the surround, and hence to the wafer retention stage, by several tooled surfaces that are secured to the surround. The surround and the tooled surfaces are typically the same material type as the wafer to ensure a consistent chemical reaction between the surface material of the wafer and the plasma. However, a depreciative etching of the surround and the tooled surfaces occurs when the plasma emitting probe is extended outside the edge of the wafer during the turnaround steps. This depreciative etching results in an additional expenditure of capital and labor in replacing the damaged surround materials.

As described above, the use of the boustrophedon type scanning method in a chemical etching process results in both mechanical and depreciated material replacement problems. It is therefore desirable to use an optimal wafer surface scan method that does not result in either mechanical or depreciated material replacement problems in a chemical etching process.

SUMMARY OF THE INVENTION

The present invention contemplates a method for optimally scanning, for example, a surface of one or more SOI semiconductor wafers undergoing a chemical etching process. This method is based on a spiral type scanning technique, a variable-rate chemical etching instrument, or a combination of the spiral type scanning technique and the variable-rate chemical etching instrument.

In the case where a single SOI wafer is undergoing a chemical etching process, the present invention can be realized in several different embodiments. For example, the wafer can be scanned by having the wafer move in a spiral pattern with respect to a stationary chemical etching instrument probe, or vice versa. In either case, if the speed of the scan is constant, the rate of the chemical etching instrument probe must be variable to accommodate for the desired amount of material to be removed. However, if the speed of the scan is variable, the rate of the chemical etching probe can be constant, thereby allowing the speed of the scan to control the desired amount of material to be removed. In all cases, the relative motion of the wafer is such that the entire surface of the wafer is scanned by the probe upon completion of the chemical etching process.

As described in the prior art, the SOI wafer is placed on a surround that is secured to a movable wafer retention stage. the wafer is registered to the surround by several tooled surfaces that are secured to the surround. Both the surround and the tooled registration surfaces are made of the same material type as the wafer to ensure a consistent chemical etching process. The wafer retention stage, and hence the SOI wafer, is controlled to move in a spiral pattern with respect to the stationary chemical etching instrument probe. It should be noted, however, that either the wafer retention stage, as described here, or the chemical etching instrument probe may perform the controlled spiral pattern movement.

As further described in the prior art, the chemical etching instrument probe emits the plasma that induces the chemical reaction to occur between the plasma and the surface material of the wafer. This chemical reaction results in a constant-rate removal of material from the surface of the wafer as well as from the surround materials.

In the present invention, the spiral pattern movement of the wafer retention stage is controlled such that the probe is only scanned over the wafer surface and not over the surround or any of the tooled registration surfaces, except for an area close to the outside edge of the wafer. This controlled movement causes the surround and the tooled registration surfaces to be minimally etched by the chemical etching instrument. Furthermore, the controlled spiral movement of the wafer retention stage does not include any of the turnaround steps that are included in a boustrophedon type scan. Thus, the mechanical stresses that are associated with such turnaround steps are not inflicted on a motor controlling the relative SOI wafer movement. This reduction in mechanical stress improves the reliability of the chemical etching instrument. Also, in the cases where a variable-rate chemical etching probe is used, the scan rate may operate at a constant rate to further minimize any mechanical stresses.

The above described spiral type scan method can also be applied in a case where several SOI wafers are undergoing a chemical etching process. Such a case will result in a chemical etching process with a higher wafer throughput rate than for just a single wafer. In this case, where there are typically gaps between the wafers, a variable-rate chemical etching probe must be used so as not to subject the surround materials to depreciative etching. However, if a reduction in mechanical stress happens to be the main requirement, the spiral type scan can still be used to eliminate stressful turnaround steps. Although, without a variable rate chemical etching probe depreciative etching will occur to the surround materials.

A primary objective of the present invention is to provide a method for optimally scanning the surface of one or more SOI semiconductor wafers undergoing a chemical etching process.

Another objective of the present invention is to provide a method for optimally scanning the surface of one or more SOI semiconductor wafers undergoing a chemical etching process, such that no depreciative etching occurs to surround materials during the process.

Another objective of the present invention is to provide a method for optimally scanning the surface of one or more SOI semiconductor wafers undergoing a chemical etching process, such that a high wafer throughput rate is obtained.

PREFERRED EMBODIMENT OF THE PRESENT INVENTION

Figure 1:
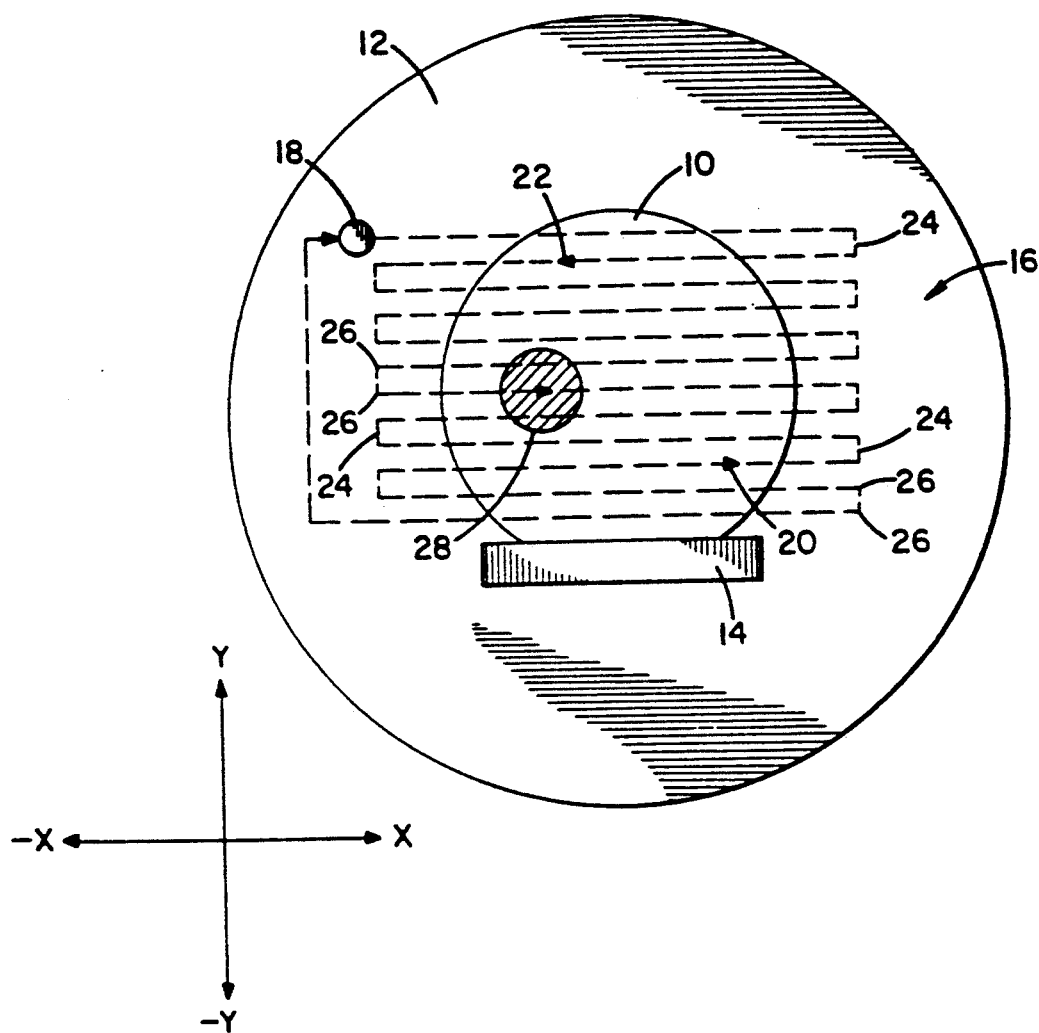
FIG. 1 illustrates a path pattern of a prior art boustrophedon type scan over a surround and a SOI semiconductor wafer.

Referring to FIG. 1, there is shown an SOI wafer 10 that is registered to a surround 12 by means of a wafer flat registration surface 14. The wafer flat registration surface 14 is secured to the surround 12. Of course, additional registration surfaces are required to retain the wafer 10 in a precise registered position. However, to enhance the clarity of the figure, these additional registration surfaces are not shown. Also shown in FIG. 1, is a path pattern 16 of a prior art boustrophedon type scan. This path pattern 16 is maintained by a mechanical control means to ensure that a chemical etching instrument probe 18 is scanned over the entire surface of the wafer 10.

The chemical etching instrument probe 18 scans across the surface of the wafer 10 in a positive 20 and a negative 22 X-axis coordinate plane direction. While the probe 18 is scanned across the wafer surface, a chemical etching process occurs within an active region 28 around the probe 18. When scanned outside the edge of the wafer 10, the probe 18 performs indexing steps 24 in a negative Y-axis coordinate plane direction. The indexing, or turnaround, steps 24 inflict mechanical stresses on the machinery that controls the boustrophedon type scan movement. These mechanical stresses are the result of two abrupt 90° turns 26 that are performed during each turnaround step 24. Furthermore, as described in the prior art, the surround 12 and the wafer registration surfaces 14 can be depreciatively etched when the probe 18 is extended outside the edge of the wafer 10 during the turnaround steps 24. This depreciative etching results in unnecessary material replacement costs.

Figure 2:
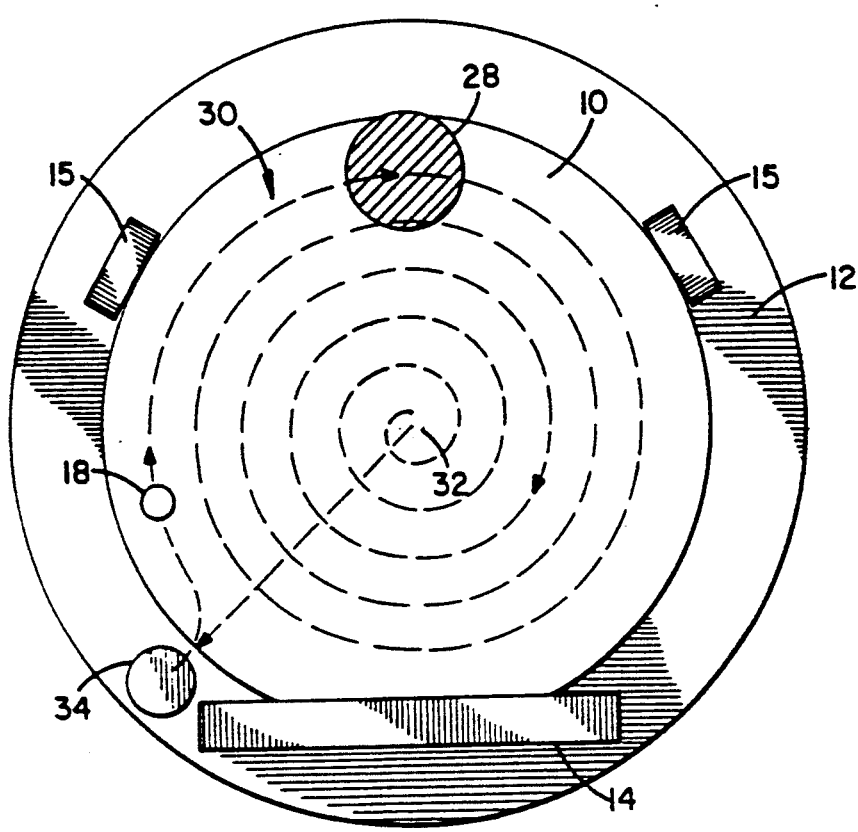
FIG. 2 illustrates a path pattern of a present invention spiral type scan over an SOI semiconductor wafer.

Referring to FIG. 2, there is shown an SOI wafer 10 that is registered to a surround 12 by means of a secured wafer flat registration surface 14 and two peripheral registration surfaces 15. A sacrificial parking pad 34 is also secured to the surround 12 alongside the edge of the wafer 10. The sacrificial parking pad 34 provides a surface upon which a chemical etching probe 18 is initialized so that no damage is done to the wafer 10, surround 12, or registration surfaces 14, 15. Also shown in FIG. 2, is a path pattern 30 of a present invention spiral type scan. The path pattern 30 of the spiral type scan is such that the chemical etching instrument probe 18 is extended only slightly outside the edge of the wafer 10, as illustrated by the active region 28. Thus, there are only minimal depreciative etching problems associated with this type of scan pattern 30. Furthermore, the path pattern 30 of the spiral type scan does not involve any turnaround steps. Thus, the spiral type scan technique does not exhibit the mechanical stress problems that are associated with the boustrophedon type scan.

The spiral type scan may, however, exhibit a central discontinuity problem. Such a problem occurs when the chemical etching instrument probe 18 reaches the wafer surface center 32. From this point 32, the probe 18 typically returns to a starting position on the sacrificial parking pad 34. This problem is manifested in that the probe 18 is typically operating at a constant plasma etching rate throughout the etching process. Thus, as the probe 18 returns to the sacrificial parking pad 34, the wafer 10 can be excessively etched along the return path.

One solution to the central discontinuity problem is to modulate the plasma etching rate of the probe 18. By doing so, once the probe 18 reaches the wafer surface center 32, the plasma etching rate can be decreased. The wafer 10 would then be relieved from excessive etching as the probe 18 returns to the sacrificial parking pad 34. Furthermore, modulation of the plasma etching rate would allow the spiral type scan 30 to be performed at a constant angular speed. In other words, the probe 18 can be spirally scanned over the surface of the wafer 10 at a constant angular speed while the plasma etching rate of the probe 18 is modulated according to the amount of wafer surface material that is desired to be etched. Otherwise, as is the case in the prior art, the plasma etching rate of the probe 18 is held constant while the scan speed is modulated to achieve a desired dwell time. The benefit of scanning at a constant angular speed is a further reduction in the amount of mechanical stress inflicted on the scan control machinery. It should be noted that modulation of the plasma etching rate can also be used in conjunction with the boustrophedon type of scan to reduce mechanical stress and minimize depreciative etching.

Figure 3:
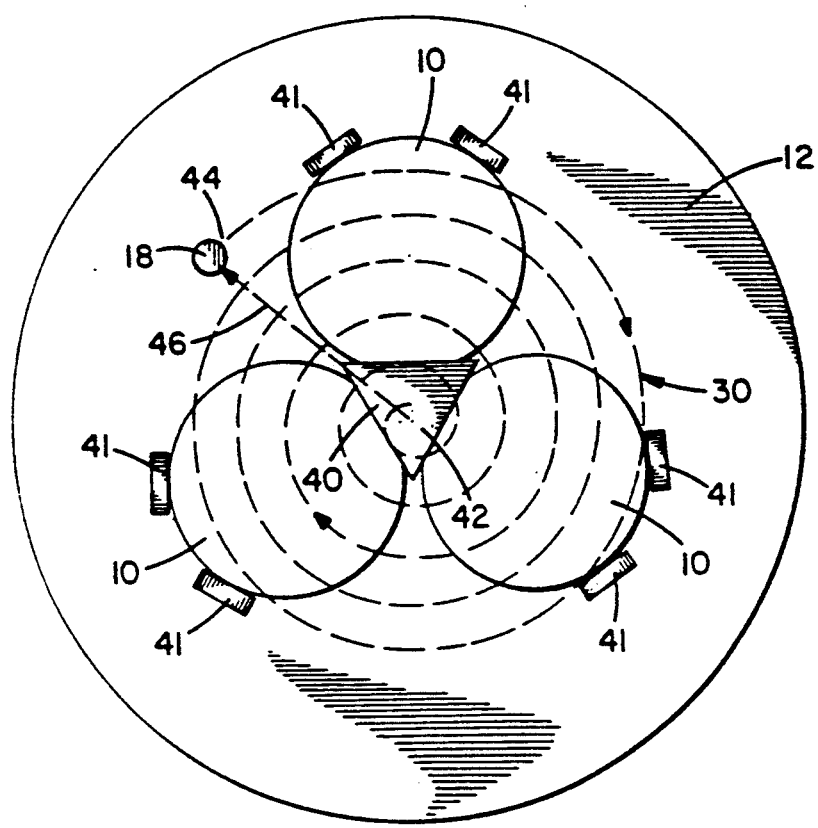
FIG. 3 illustrates a path pattern of a present invention spiral type scan over a surround and three SOI semiconductor wafers.

If modulation of the plasma etching rate is not a viable option, the central discontinuity problem may be alleviated by applying the present invention in a case as shown in FIG. 3. In this application, three SOI wafers 10 are registered to a surround 12 by means of a central wafer flat registration surface 40 and several peripheral wafer registration surfaces 41. The chemical etching instrument probe 18 follows the path pattern 30 of the present invention spiral type scan over the surfaces of all three wafers 10. The spiral type scan begins at a starting point 44 that is within the surround 12, but outside the surfaces of the wafers 10. When the probe 18 reaches a center point 42 in the path pattern 30, it returns to the starting point 44. The return path 46 of the probe 18 does not, however, scan over the surface of any of the three wafers 10, as in the case of FIG. 2. Thus, none of the three wafers 10 in FIG. 3 are excessively etched. Furthermore, as previously described, the spiral type scan does not involve any turnaround steps. Thus, the spiral type scan does not exhibit the mechanical stress problems of the boustrophedon type scan.

The spiral type scan of FIG. 3 can, however, result in a problem of depreciative etching unless the etch rate of the chemical etching probe 18 is modulated. This depreciative etching problem can occur to the surround 12, the central wafer flat registration surface 40, and to the peripheral wafer registration surfaces 41. Nevertheless, the overall benefit of eliminating the mechanical stress problems, and also increasing the wafer throughput rate, can outweigh the problem of depreciative etching.

Figure 4:
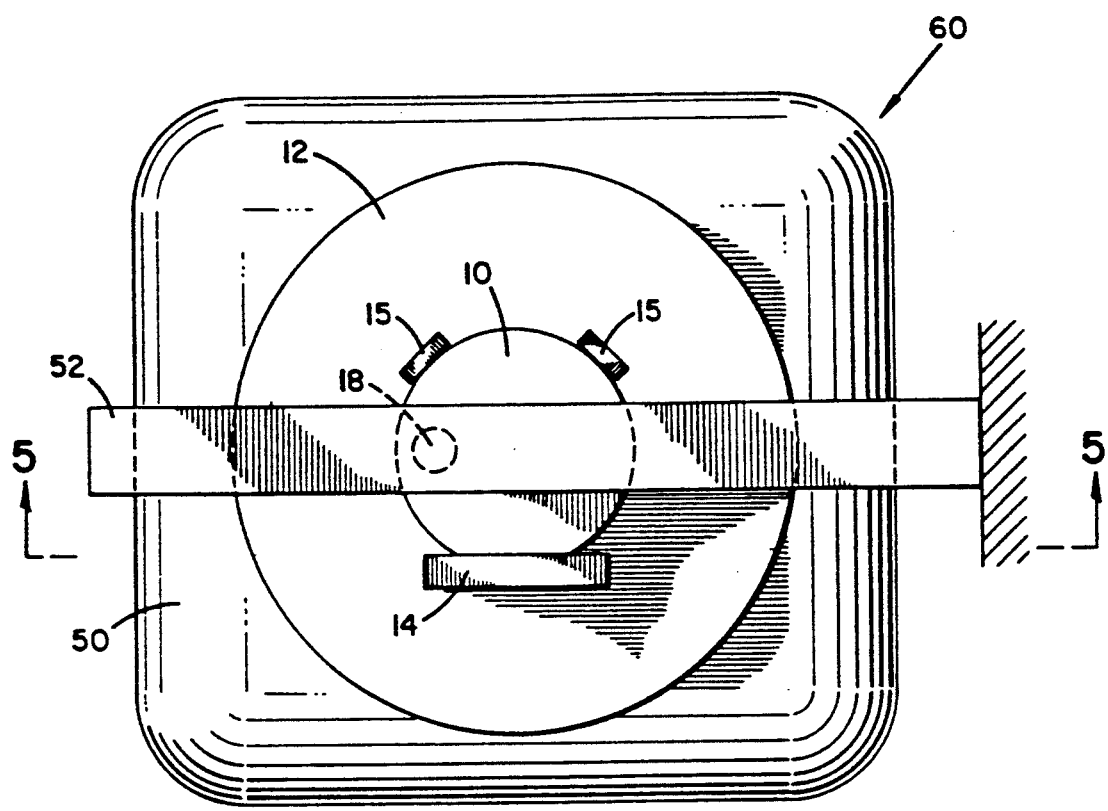
FIG. 4 is a top view of a chemical etching instrument taken along line 4—4 of FIG. 5.
Figure 5:
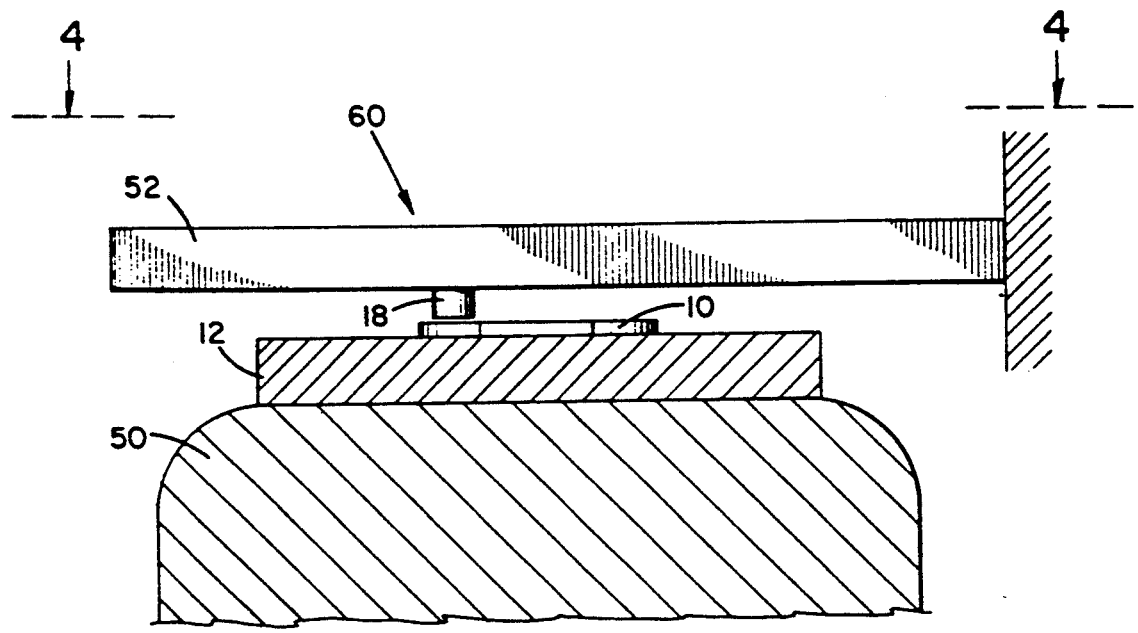
FIG. 5 is a side view of a chemical etching instrument taken along line 5—5 of FIG. 4.

Referring to FIGS. 4 and 5, there is shown a top-view and a side-view, respectively, of a typical chemical etching instrument 60. In this instrument 60, a wafer 10 is registered to a surround 12 by means of a wafer flat registration surface 14 and two peripheral wafer registration surfaces 15. The registration surfaces 14, 15 are secured to the surround 12 and the surround 12 is secured to a wafer retention stage 50. Also, a chemical etching instrument probe 18 is secured to a probe stage 52.

Using the chemical etching instrument 60, the spiral type scanning technique of the present invention can be performed using several different approaches. First, the wafer retention stage 50, and hence the wafer 10, can move in a spiral pattern under a stationary etching probe 18. Second, the probe stage 18, and hence the chemical etching instrument probe 18, can move in a spiral pattern over a stationary wafer 10. Third, the wafer retention stage 50 can move in a circular pattern while the probe stage 52 moves the probe 18 along a radius of the wafer 10, or vice versa. This third approach is the most practical as it allows common circular and straight line path patterns to be used. It should be noted, however, that the present invention is not limited to only these approaches, as any number of relative movements between the wafer 10 and the probe 18 are possible. Also, any of these approaches can be supplemented by modulating the chemical etching rate so as to obtain the desired amount of material removal and minimize any depreciative etching problems.

Figure 6:
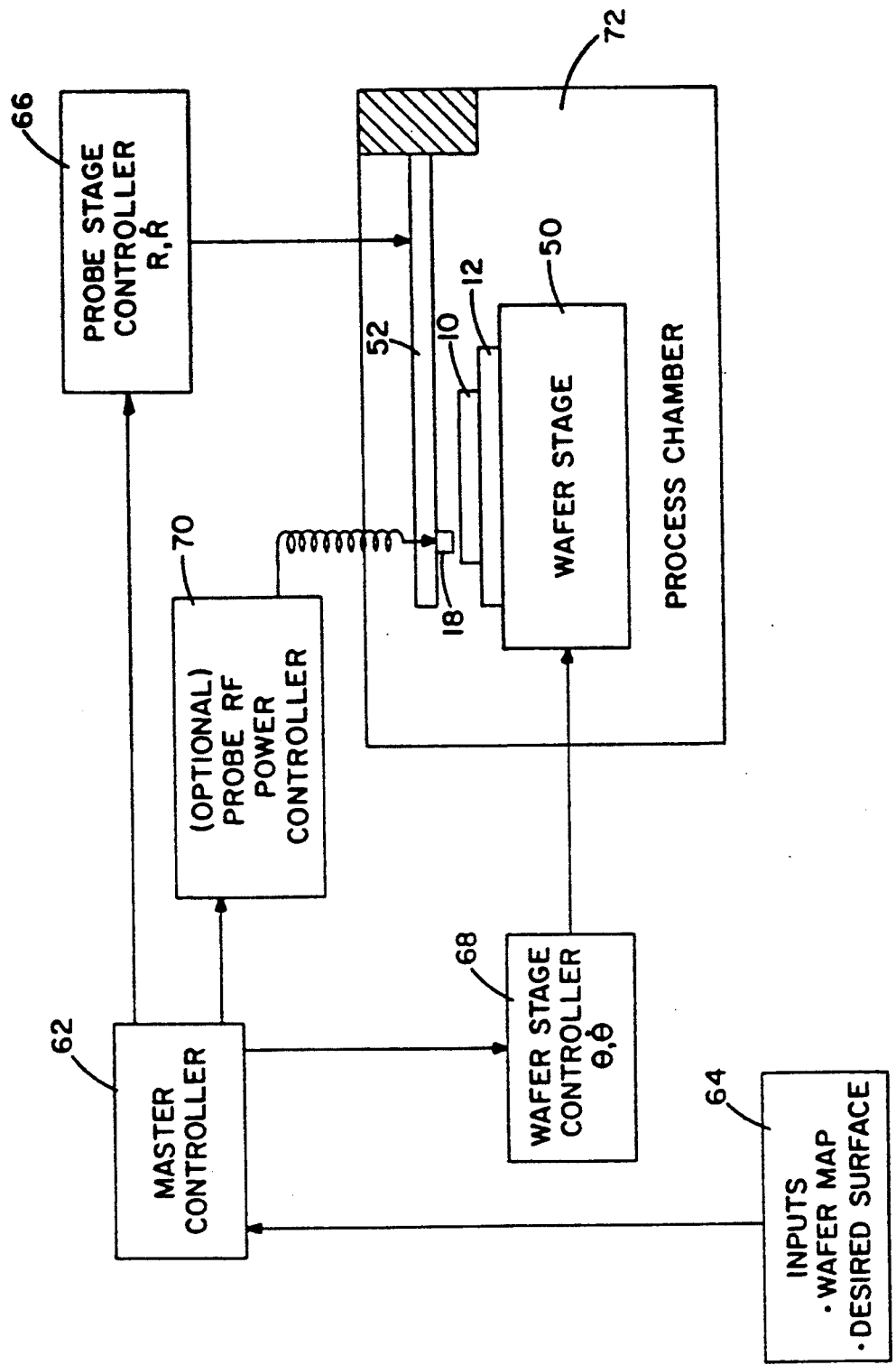
FIG. 6 is a schematic representation of a system for performing a chemical etching process on a wafer.

Referring to FIG. 6, there is shown a schematic representation of a system for performing a chemical etching process on a wafer 10 using the above-described third approach according to present invention. The overall spiral movement is controlled by a master controller 62 upon inputs 64 from the user. These inputs 64 comprise a map of the present thickness of the wafer and a desired subsequent wafer thickness after the completion of etching. The master controller 62 controls the radial movement of a probe stage controller 66, the circular movement of a wafer stage controller 68, and the chemical etching rate through an optional probe RF power controller 70. The actual chemical etching process occurs inside a process chamber 72 where wafer retention stage 50, the surround 12, the wafer 10, the probe stage 52, and the probe 18 are located. Such a chamber 72 is generally required to create ideal process conditions.

It is thus seen that the objectives set forth above are efficiently attained and, since certain changes may be made to the above described apparatus and method without departing from the scope of the invention, is intended that all matter contained in the above description or shown in the accompanying drawings shall be interrupted as illustrative and not in a limiting sense.

What is claimed is:

1. An apparatus for optimally scanning a surface of one or more semiconductor wafers undergoing a chemical etching process using a chemical etching instrument probe, said apparatus comprising;
    means for registering said one or more semiconductor wafers to a wafer retention stage; and
    means for controlling a spiral pattern movement of a spiral type scan of said surface of one or more semiconductor wafers by said chemical etching instrument probe, whereby said surface is figured to correspond to a desired thickness.

2. The apparatus as described in claim 1, wherein said means for registering comprises:
    a surround;
    a wafer flat registration surface secured to said surround; and
    a plurality of peripheral registration surfaces secured to said surround.

3. The apparatus as described in claim 1, wherein said means for controlling comprises a master controller for controlling said spiral pattern movement of said spiral type scan.

4. The apparatus as described in claim 3, wherein said means for controlling further comprises a wafer stage controller for controlling a movement of said wafer with respect to said probe.

5. The apparatus as described in claim 3, wherein said means for controlling further comprises a probe stage controller for controlling a movement of said probe with respect to said wafer.

6. The apparatus as described in claim 1, wherein said apparatus further comprises means for modulating a chemical etching rate of said chemical etching instrument probe, whereby said surface is figured to correspond to a desired thickness.

7. An apparatus for optimally scanning a surface of one or more semiconductor wafers undergoing a chemical etching process using a chemical etching instrument probe, said apparatus comprising;
- means for registering said one or more semiconductor wafers to a wafer retention stage;
- means for controlling a boustrophedon type scan of said surface of one or more semiconductor wafers by said chemical etching instrument probe; and
- means for modulating a chemical etching rate of said chemical etching instrument probe, whereby said surface is figured to correspond to a desired thickness.

8. The apparatus as described in claim 7, wherein said means for modulating comprises a means for modulating an RF power of said chemical etching probe.

* * * * *